(12) United States Patent
Koga et al.

(10) Patent No.: US 6,355,940 B1
(45) Date of Patent: Mar. 12, 2002

(54) DISPLAY DEVICE AND SEMICONDUCTOR DEVICE HAVING LASER ANNEALED SEMICONDUCTOR ELEMENTS

(75) Inventors: Masayuki Koga, Gifu; Katsuya Kihara, Kobe, both of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/148,854

(22) Filed: Sep. 4, 1998

(30) Foreign Application Priority Data

Sep. 8, 1997  (JP) .............................. 9-243057

(51) Int. Cl.$^7$ .............................................. H01L 29/04
(52) U.S. Cl. ............................................ 257/59; 257/72
(58) Field of Search ..................... 257/59, 72

(56) References Cited

U.S. PATENT DOCUMENTS

| | | |
|---|---|---|
| 4,466,179 A | 8/1984 | Kasten |
| 5,145,808 A | 9/1992 | Sameshima et al. |
| 5,529,951 A | 6/1996 | Noguchi et al. |
| 5,589,406 A | 12/1996 | Kato et al. ............. 437/21 |
| 5,591,668 A | 1/1997 | Maegawa et al. ........ 437/174 |
| 5,789,763 A * | 8/1998 | Kato et al. ............. 257/72 |
| 5,808,318 A * | 9/1998 | Masumo et al. ......... 257/72 |
| 5,808,595 A | 9/1998 | Kubota et al. .......... 345/92 |
| 5,903,014 A | 5/1999 | Ino et al. ............... 257/66 |
| 5,942,856 A * | 8/1999 | Koyama ................. 315/169.3 |
| 5,943,593 A * | 8/1999 | Noguchi et al. ........ 438/487 |
| 5,960,323 A | 9/1999 | Wakita et al. |
| 5,981,974 A | 11/1999 | Makita ................... 257/72 |
| 6,028,577 A | 2/2000 | Sakamoto ............... 345/92 |
| 6,037,924 A | 3/2000 | Koyama et al. ......... 345/92 |

OTHER PUBLICATIONS

Kubo et al., "Characteristics of Polycrystalline–Si Thin Film Transistors Fabricated by Excimer Laser Annealing Method", IEEE Transactions on Electron Devices, Oct. 1994, pp. 1876–1879.

Kohno et al., "High Performance Poly–Si TFTs Fabricated Using Pulsed Laser Annealing and Remote Plasma CVD With Low Temperature Processing", IEEE Transactions on Electron Devices, Feb. 1995, pp. 251–257.

Kuriyama, "Excimer Laser Crystallization of Silicon Films for AMLCDs", AMLCK Second International Workshop on Active Matrix Liquid Crystal Displays, Sep. 1995, pp. 87–92.

* cited by examiner

Primary Examiner—Sara Crane
(74) Attorney, Agent, or Firm—Hogan & Hartson, L.L.P.

(57) ABSTRACT

Two charge transfer passages of one TFT, which comprise two areas with island layers of p-Si intersecting at right angles and running from respective drain areas ND, PD to source areas NS, PS through an LD area LD and a channel area CH, are arranged non-parallel to each other. Even if a defective crystallization area R, which is caused due to uneven intensity in an irradiated area in laser annealing for forming p-Si of a p-Si TFT LCD, passes across the TFT area, and either of the transfer passages is defective, the remaining one operates normally, and the component characteristics are maintained as desired.

9 Claims, 19 Drawing Sheets

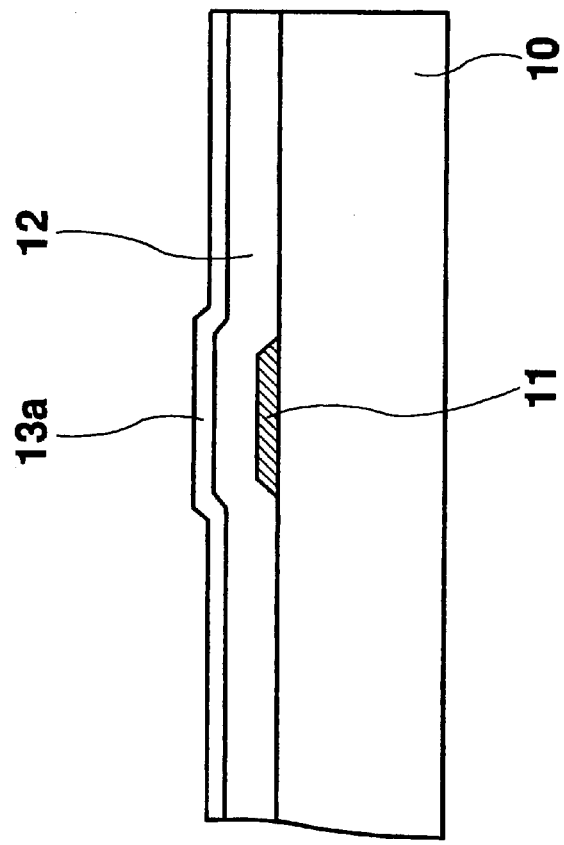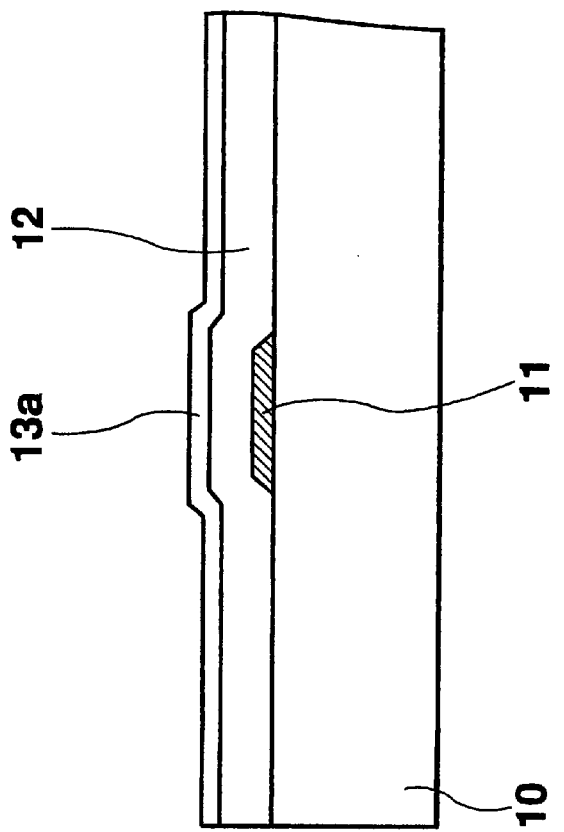
Fig. 11

DISPLAY DEVICE AND SEMICONDUCTOR DEVICE HAVING LASER ANNEALED SEMICONDUCTOR ELEMENTS

BACKGROUND OF THE INVENTION a) Field of the Invention

The invention relates to a semiconductor device and a method for manufacturing a semiconductor device, particularly a display included a built-in driver circuit which is integrated a thin film transistor (TFT) as a switching element for a display area and also configuring a driver circuit on the panel end, and used for an active matrix display device such as a liquid crystal display (LCD) and an electroluminescent (EL) display.

b) Description of the Related Art

Due to their advantages in terms of compactness, thinness and reduced power consumption, LCDs have come into widespread practical use in the fields of OA equipment and AV equipment in recent years. In particular, an active matrix type LCD with a TFT arranged on each pixel as a switching element for controlling rewriting timing of pixel data can display moving pictures on a large display with high resolution and is used for various types of TVs and as monitors for personal computers and the like.

An EL display device having organic EL as an optical member was also developed to remedy viewing angle-dependent problems of LCDs. TFTs are also used as switching elements to drive each EL element.

A TFT is a field effect transistor (FET), which is obtained by forming a metal layer and a semiconductor layer into a predetermined shape on an insulating substrate. In the active matrix type LCD, the TFT is connected to each capacitor, which is formed between a pair of substrates with liquid crystal sandwiched therebetween to drive the liquid crystal.

Specifically, instead of amorphous silicon (a-Si) which has been used a lot as the semiconductor layer, LCD using polycrystalline silicon (p-Si) was developed. Annealing with laser light is also used for forming or growing p-Si grains. Generally, p-Si has higher mobility than a-Si, a TFT is downsized, and a high aperture ratio and high resolution can be achieved. Since a gate self-align structure can be adopted, a TFT can be made fine, and parasitic capacitance can be decreased. Thus, the TFT can be made fast. An electrical complementary connection structure of n-ch TFT and P-ch TFT, namely CMOS (complementary metal oxide semiconductor), can also be formed, and a high-speed driving circuit can be configured. Therefore, integral formation of the driving circuit in the periphery of the pixel area on the same substrate allows reduction in the manufacturing cost and reduction in size of the LCD module.

Methods for forming a p-Si film on the insulating substrate include annealing for crystallization of a-Si prepared at a low temperature and a solid phase crystallization in a high temperature state, both requiring processing at a high temperature of 600° C. or more. Therefore, an inexpensive non-alkali glass substrate cannot be used as the insulating substrate because of its inferior heat resistance, and an expensive quartz glass substrate is required, resulting in high costs. Meanwhile, there is developed a method enabling the use of a non-alkali glass substrate as the insulating substrate. This method employs laser annealing to polycrystallize silicon with a substrate at a relatively low temperature of 600° C. or below. Such a process having a processing temperature of 600° C. or below throughout the whole process of the TFT substrate production is called a low-temperature process, which is essential for mass-production of low-cost LCDS.

FIG. 1 is a plan view showing relationships between a subject substrate 1 to be processed and irradiating and scanning directions of the excimer laser in the excimer laser annealing (ELA) effected by irradiating laser light. The subject substrate 1 is an ordinary non-alkali glass substrate, which has a-Si formed on its surface. The substrate 1 is a mother glass substrate having six active matrix substrates 5 for constituting an LCD. The individual active matrix substrate 5 comprises a display area 2 having pixels arranged in a matrix at the center, and a gate driver 43 and a drain driver 44 which are formed around the display area 2. In the display area 2, a pixel electrode which is one of the electrodes of a pixel capacitor for driving the liquid crystal is to be arranged in a matrix, and p-Si TFTs which are prepared by polycrystallizing by ELA are connected to them. The gate driver 43 is mainly formed of a shift resister, while the drain driver 44 is mainly formed of a shift resister and a sampling circuit. These drivers 43, 44 are formed of TFT arrays such as CMOS using the p-Si film prepared by polycrystallization by ELA.

A pulse laser is used for ELA, and each pulse laser beam being irradiated has its edge indicated as C having, e.g., a line width of 0.5 to 1.0 mm and a line length of 80 to 150 mm, in FIG. 1. The line beam is moved on the subject substrate 1 while overlapping as predetermined, so that the laser light is fully irradiated to process a large area of the substrate 1, thereby polycrystallizing a-Si.

FIG. 2 shows TFTs formed on the subject substrate 1, and particularly a plan configuration of an inverter portion used at respective parts in the drivers 43, 44. FIG. 3 is a sectional view taken along line B—B of FIG. 2. A gate electrode 51 connected to an input of the inverter is formed on a transparent substrate 50 of a non-alkali glass substrate or the like, and a gate insulating film 52 is formed to cover the gate electrode 51.

A p-Si film 53, which is formed by ELA, is formed on the gate insulating film 52 like islands to lie across over the gate electrode 51 in N-ch and P-ch areas. The part of the p-Si film 53 just above the gate electrode 51 is a non-doped channel area CH. On the N-ch side, an LD (lightly doped) area LD doped with a low concentration of N-type impurities is formed on both sides of the channel area CH, and a source area NS and a drain area ND, which are doped with a high concentration of N-type impurities, are formed next to the LD areas LD. On the P-ch side, the non-doped channel area CH has on both its sides a source area PS and a drain area PD which are doped with a high concentration of P-type impurities.

An implantation stopper 54 used to form the source and drain areas PS, PD remains on the channel area CH. An interlayer insulating film 55 is formed to cover the p-Si film 53 and the implantation stopper 54. A source electrode 56 and a drain electrode 57 are formed on the interlayer insulating film 55 and connected to the source areas NS, PS and the drain areas ND, PD of the p-Si film 53 through contact holes CT formed in the interlayer insulating film 55. The drain electrode 57 is connected to an output of the inverter, the source electrode 56 on the N-ch side to a low voltage source, and the source electrode 56 on the P-ch side to a high voltage source.

An insulating film 58 having a planarization is formed to fully cover the electrodes. A TFT used as the switching element on the display area 2 is generally an N-ch type and has the same structure as the left sides of FIG. 2 and FIG. 3.

A pixel electrode (not shown) for driving the liquid crystal is formed on the planarizating insulating film 58 and connected to the source electrode 56 through the contact holes formed in the planarizating insulating film 58.

FIG. 2 shows particularly the inverter portion of the drivers 43, 44. Such an element related to the logical operation is determined at the time of designing to have a W/L value so to decide performance characteristics. Accordingly, the TFT of N-ch and P-ch shown in FIG. 2 has the island layer of the p-Si film 53 and the gate electrode 51 which are formed to have a width and the like so to fulfill a designed channel width W and a designed channel length L. A single channel area CH having such a value is formed for the individual element.

The p-Si film formed by the excimer laser annealing (ELA) has a disadvantage that a grain size does not become large enough, and a linear area poor in crystallinity is produced in sides of a linear pulse laser beam, particularly in its longitudinal direction, causing stripes as indicated by R in FIG. 1 and FIG. 2.

Such a defective crystallization area R of the p-Si film has poor crystallinity, and TFT formed in the area containing such an area is generally poor in characteristics.

A TFT to be formed on the subject substrate 1, if it was prepared including such a defective crystallization area R, has generally deteriorated element characteristics.

Occurrence of such an area with locally poor crystallinity is assumed to be a result of the following. Where a-Si is crystallized by ELA to prepare p-Si, the laser energy and the grain size are related to each other as shown in FIG. 4. It is apparent from FIG. 4 that the grain size increases up to a given energy value with the increase of energy, but when the energy value exceeds energy Eo for providing the largest grain size, the grain size suddenly becomes small. Therefore, in order to obtain a predetermined grain size GM or more, the laser energy irradiated must be in a range between an upper limit Eu and a lower limit Ed.

However, as shown in FIG. 5, the irradiated line beam has distribution of irradiated light intensity with respect to the position, which is not completely flat in a section A of the line width (in a breadth direction) of the beam line. The line width A specified by an optical mechanism of a laser beam irradiating apparatus substantially has a sharp edge and a distribution shape with a flat energy Eo. However, as indicated by X or Y in FIG. 5, there are portions where the intensity increases and decreases sharply and exceeds an allowable range Ed-Eu of energy to obtain an optimum grain size.

The occurrence of the excessively high portion X and the excessively low portion Y in the irradiated energy is assumed to mainly result from particles or the like adhering to any lenses of the optical system of the laser irradiation apparatus. They cause shading, diffraction, interference or the like, leading to uneven intensity, which is extended in the direction of the line length after the optical system converges the laser in a direction of the line width. Thus, if the particles causing the inconsistencies in the light are present in a clean room even in a very small amount, the optical characteristics are affected, and the flat distribution of light intensity is degraded. For the time being, it is difficult to make the characteristic shown in FIG. 5 fully flat by thoroughly preventing the adhesion of such particles. Therefore, an area having defective crystallinity can be prevented from being formed in a direction along the linear pulse laser, particularly along the long sides.

Further, the irradiated energy is variable even among the shots of pulse laser beams, and the defective crystallization area R is produced or not on the subject substrate 1. Further, when the irradiated energy of a given shot of the line beam from the pulse laser is out of the optimum range Ed-Eu, no shot comes after at the last end portion in the scanning direction of the line beam, and crystallinity is not restored. Consequently, a linear detective crystallization area R is formed.

A TFT having the structure as shown in FIG. 2 is formed on the subject substrate 1 of FIG. 1. In this TFT, for example, when the LCD is constructed, the channel area CH is formed at the intersection of the gate electrode 51 formed in a horizontal scanning direction H or a vertical scanning direction V (horizontal scanning direction H in FIG. 2) and the p-Si film 53 formed across the gate electrode 51. In this channel area CH, an electrical charge being controlled for conduction/non-conduction is moved through a channel connecting the source areas NS, PS and the drain areas ND, PD. Also, as shown in FIG. 2, the channel area CH has the channel length L in the vertical direction of the drawing and the vertical scanning direction V on the LCD. The channel width W is in the horizontal direction in the drawing and in the horizontal scanning direction H on the LCD. In the configuration as described above, where the defective crystallization area R occurs in the direction as shown in FIG. 2, it may happen that a width T of the defective crystallization area R is larger than a channel width W of the channel area CH, and the defective crystallization area R may occupy most of the channel area CH. The TFT's performance characteristics are also degraded compared with another TFT. Since these TFTs are used by the drivers 43, 44 which drive the pixels of the LCD, the degradation of the performance characteristics of the TFTs leads to degradation of the display quality such as a shift of drive timing or variations in display characteristics of given lines or columns of the display area 2.

SUMMARY OF THE INVENTION

The invention has been achieved to remedy the above-described disadvantages and has the following characteristics.

A display device comprises, a plurality of pixel electrodes formed on a substrate; a plurality of first thin film transistors, which are connected to corresponding pixel electrodes among the plurality of pixel electrodes and respectively supply the connected pixel electrodes with a display signal; and a plurality of second thin film transistors, which constitute a driving circuit for driving the plurality of first thin film transistors; wherein some or all of the plurality of second thin film transistors have a plurality of channel areas formed in a semiconductor layer subjected to laser annealing respectively, and the plurality of channel areas are electrically connected in parallel to each other and arranged separately.

When the laser annealing is performed to improve the quality of the semiconductor layer, such as obtaining a polycrystallized semiconductor layer by polycrystallizing, for example, an amorphous semiconductor layer, a defectively annealed area extending in a certain direction is formed in the semiconductor layer and overlaid on some of the plurality of channel areas constituting one semiconductor element, and the pertinent portions have defective performance characteristics. However, by configuring as described above, the other channel area of the same semiconductor element is highly likely to be excluded from the defectively processed area. Therefore, the characteristics of the semiconductor element as a whole are not degraded, and electrical operation can be carried out normally. Accordingly, where the present invention is applied to, for example, a liquid crystal display, a high-performance p-Si TFT LCD with drivers built in can be obtained.

Thus, by configuring as described above, even if a defectively processed area is overlaid on any channel area, the possibility of overlaying the defectively processed area on the other channel area becomes very low.

Furthermore, according to another aspect of the invention, the plurality of channel areas are separated in a direction of the cannel width.

Thus, the channel area which becomes a defectively processed area is reduced, and the element having a larger channel width can be obtained.

Another aspect of the invention relates to a display, which comprises, a plurality of pixel electrodes formed on the substrate; a plurality of first thin film transistors, which are connected to corresponding pixel electrodes among the plurality of pixel electrodes and respectively supply the connected pixel electrodes with a display signal; and a plurality of second thin film transistors, which constitute a driving circuit for driving the plurality of first thin film transistors; wherein some or all of the plurality of second thin film transistors have a plurality of channel areas formed in a semiconductor layer subjected to laser annealing respectively, and the plurality of channel areas are electrically connected in parallel to each other and arranged in different directions.

The plurality of channel areas can be arranged so to be made orthogonal to each other in a direction of the channel width. Also, the plurality of channel areas can be formed in the same island semiconductor layer or arranged separately to each other.

Still another aspect of the invention relates to a semiconductor device having a plurality of semiconductor elements on a substrate, wherein some or all of the semiconductor elements have a plurality of channel areas which are formed in a semiconductor layer subjected to laser annealing respectively, and the plurality of channel areas are electrically connected in parallel to each other and arranged separately and/or arranged in different directions to each other.

In addition to the display described above, a semiconductor device having such a plurality of semiconductor elements can also prevent the characteristics of the semiconductor elements from being degraded due to a defectively processed area caused in the same direction on the semiconductor layer which is laser-annealed as described above.

BRIEF DESCRIPTION OF THE DRAWINGS

FIGS. 10, 11, 12, 13, 14, 15, 16, 17 and 18 are sectional diagrams showing steps of manufacturing an LCD according to an embodiment of the invention.

DETAILED DESCRIPTION OF THE PREFERRED EMBODIMENTS

Figure 1:
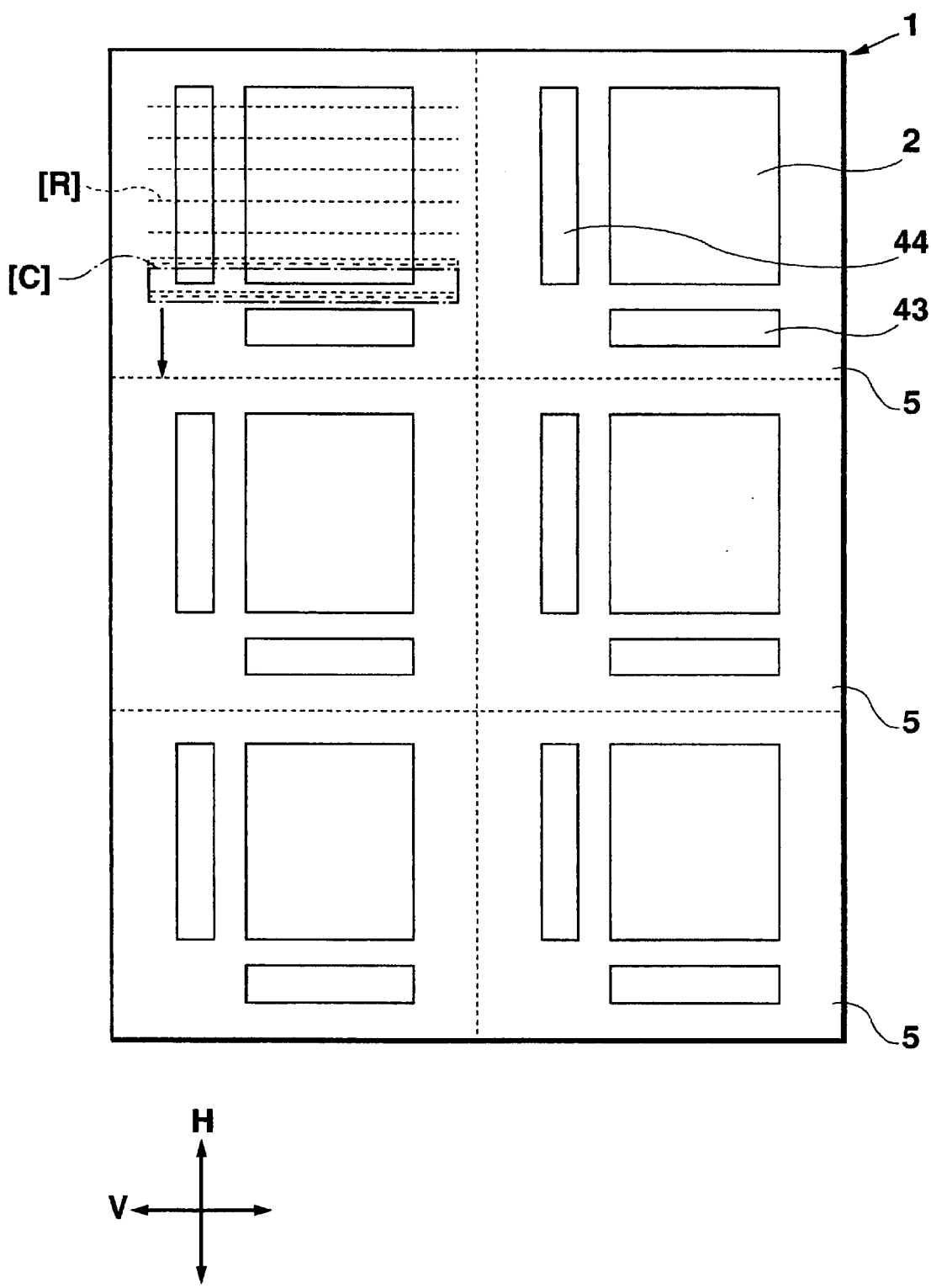
FIG. 1 is a diagram showing a layout of respective circuit elements on a subject substrate to be processed of a p-Si TFT LCD and positional relations between the subject substrate and an area irradiated with a line beam.

Referring to the accompanying drawings, preferred embodiments of the invention are described. Components corresponding to those of the drawings already described are also given like reference numerals, and description thereof is omitted.

Figure 6:
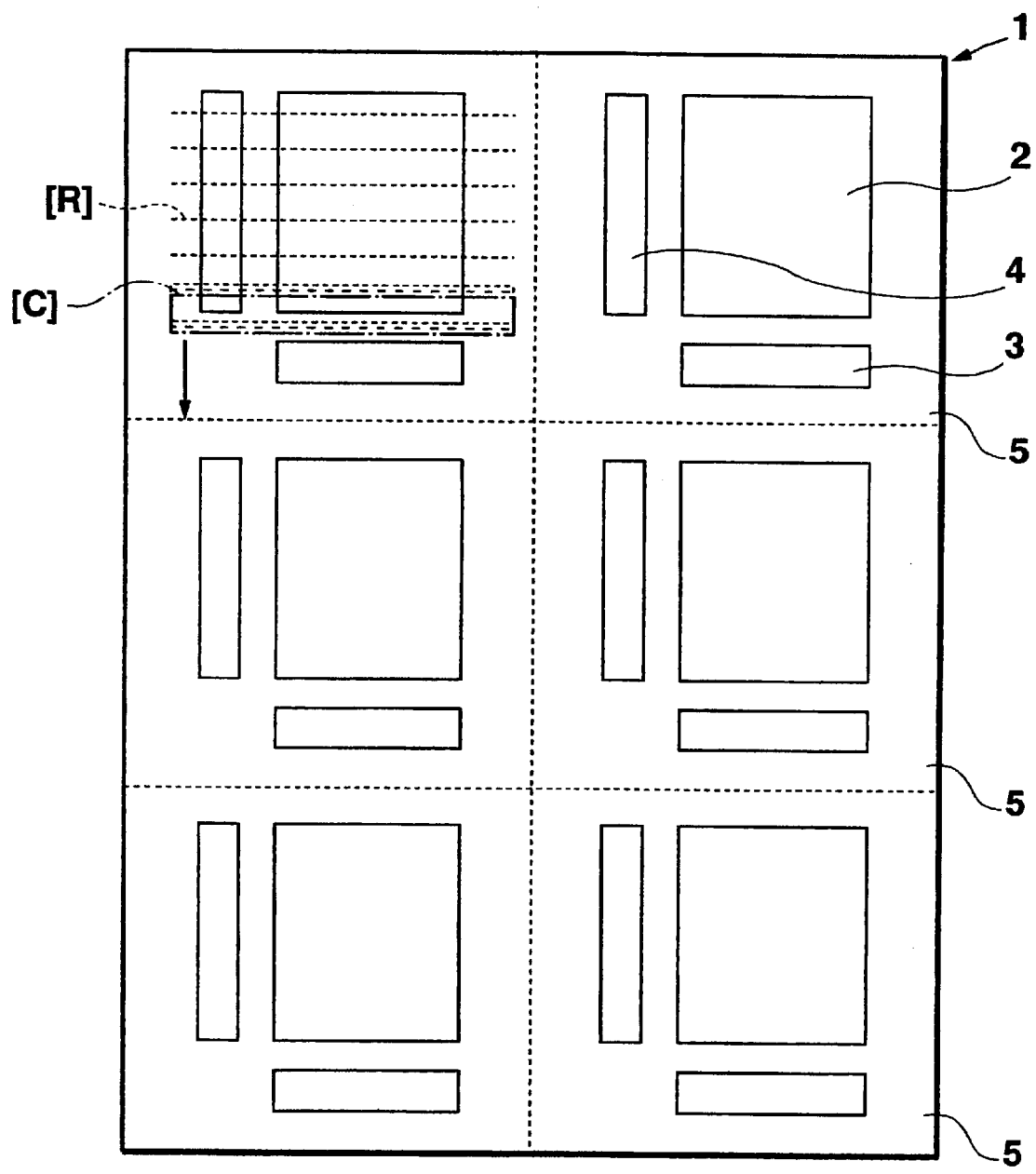
FIG. 6 is a diagram showing a layout of respective circuit elements on a subject substrate to be processed of an LCD according to an embodiment of the invention and positional relations between the subject substrate arid an area irradiated with a line beam.

A driver built-in p-Si TFT LCD of this embodiment is constructed by using active matrix substrates 5 formed in multiple numbers simultaneously from a large subject substrate 1 (mother substrate) to be processed as shown in FIG. 6. The individual active matrix substrate 5 of FIG. 6 is subjected to a variety of manufacturing steps to form a display area 2 thereon, and at the same time, a gate driver 3 and a drain driver 4 are formed in a vertical direction V and in a horizontal direction H along a side of the display area 2 respectively. FIG. 6 schematically shows an ELA step, where an a-Si film is formed on the substrate 1, and following that a pulse laser having the appearance indicated by C in the drawing is irradiated by a laser irradiating apparatus, to be described later, to polycrystallize the a-Si so to form a p-Si film. In the LCD, the gate driver 3 mainly comprises a shift resister in an inverter configuration, and the drain driver 4 mainly comprises a shift register in an inverter configuration and a sampling circuit. Many of the circuits in these drivers 3, 4 comprise TFT arrays in a CMOS configuration provided with the p-Si film which is obtained by polycrystallizing the a-Si.

The vertical direction V and the horizontal direction H shown in FIG. 6 and the following description and drawings coincide with vertical and horizontal scanning direction on an LCD finally obtained.

Figure 7:
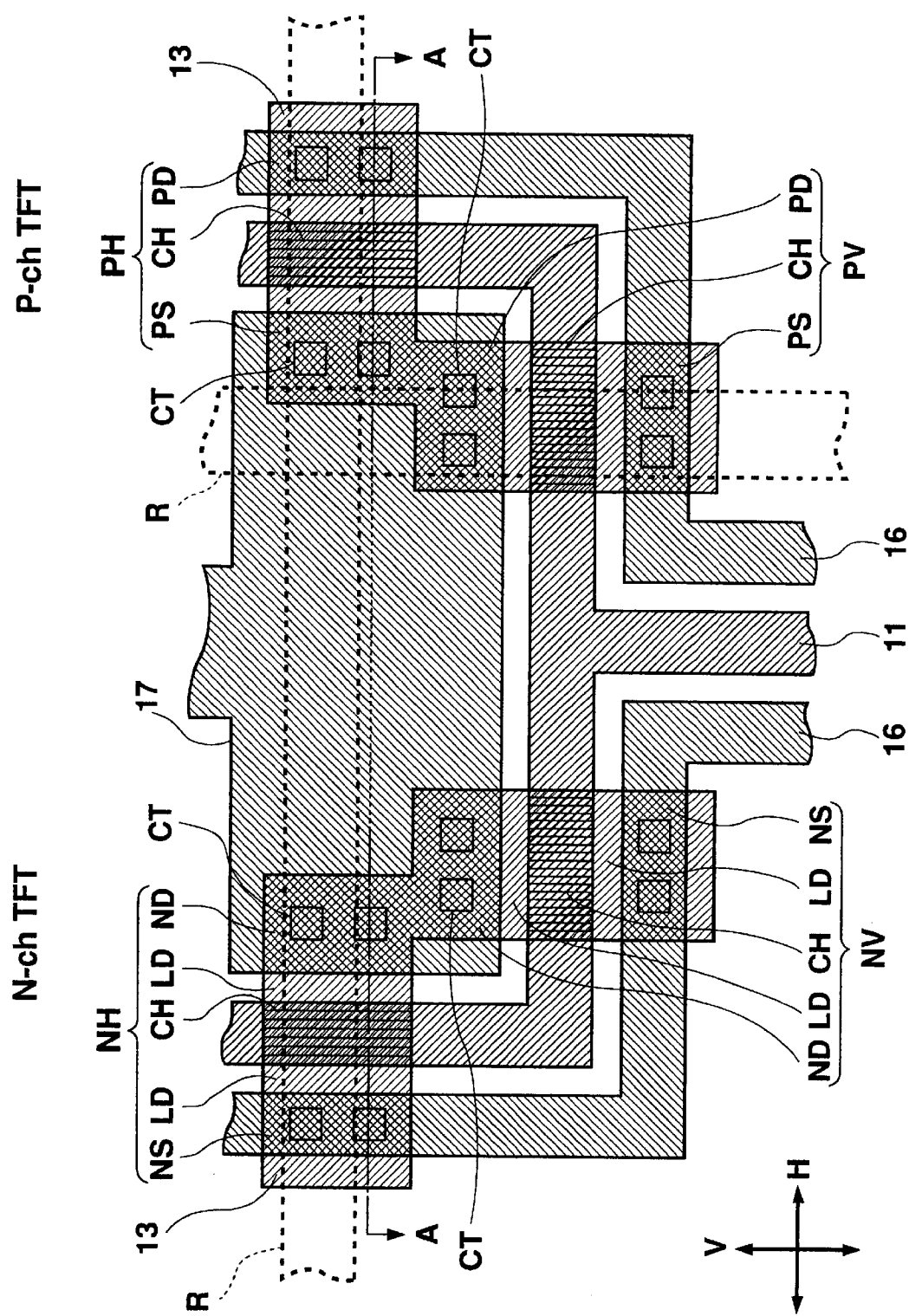
FIG. 7 is a plan view showing an example of the TFT configuration of the driver of LCD according to an embodiment of the invention.
Figure 8:
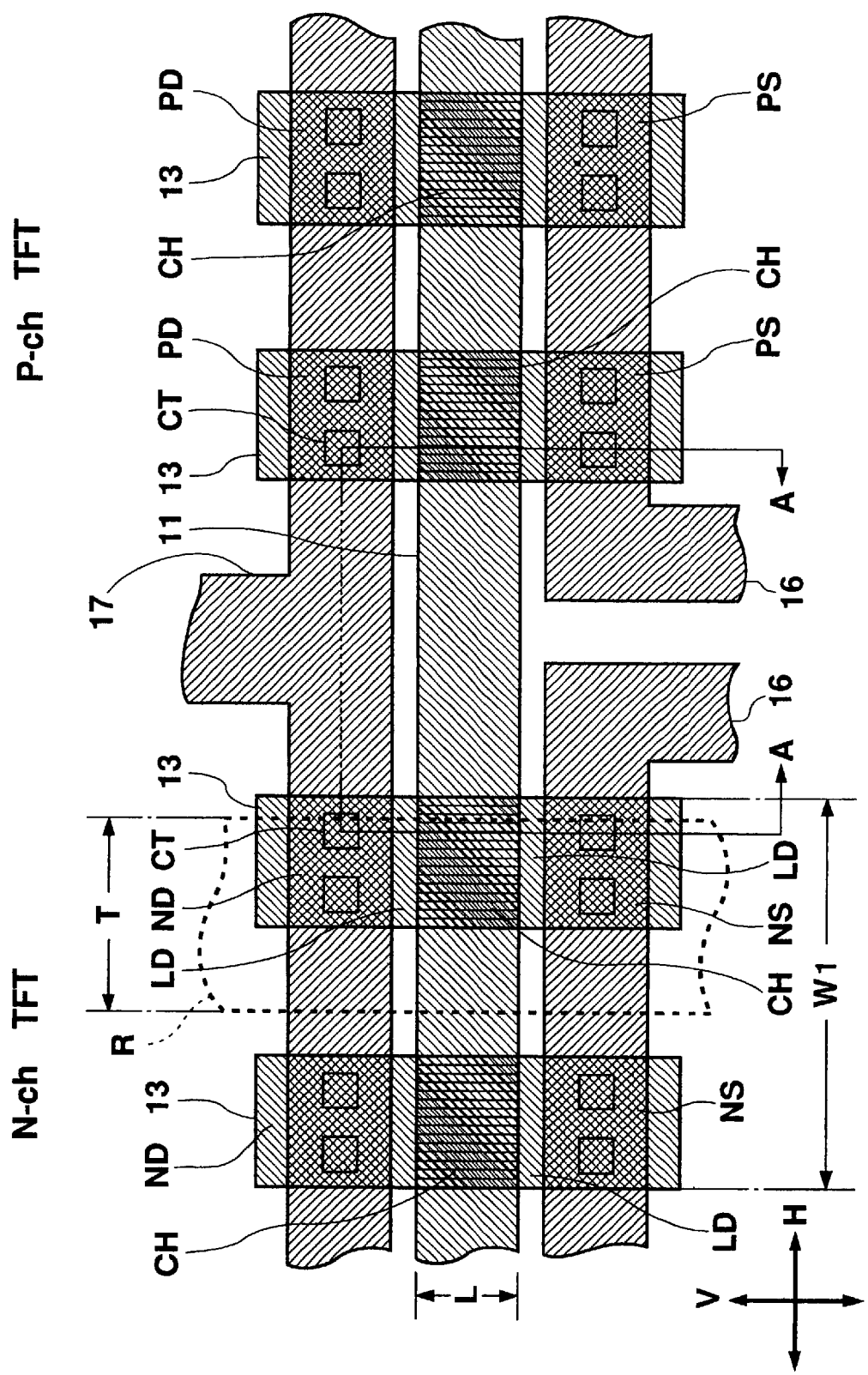
FIG. 8 is a plan view showing an example of the TFT configuration of the driver of LCD according to another embodiment of the invention.
Figure 9:
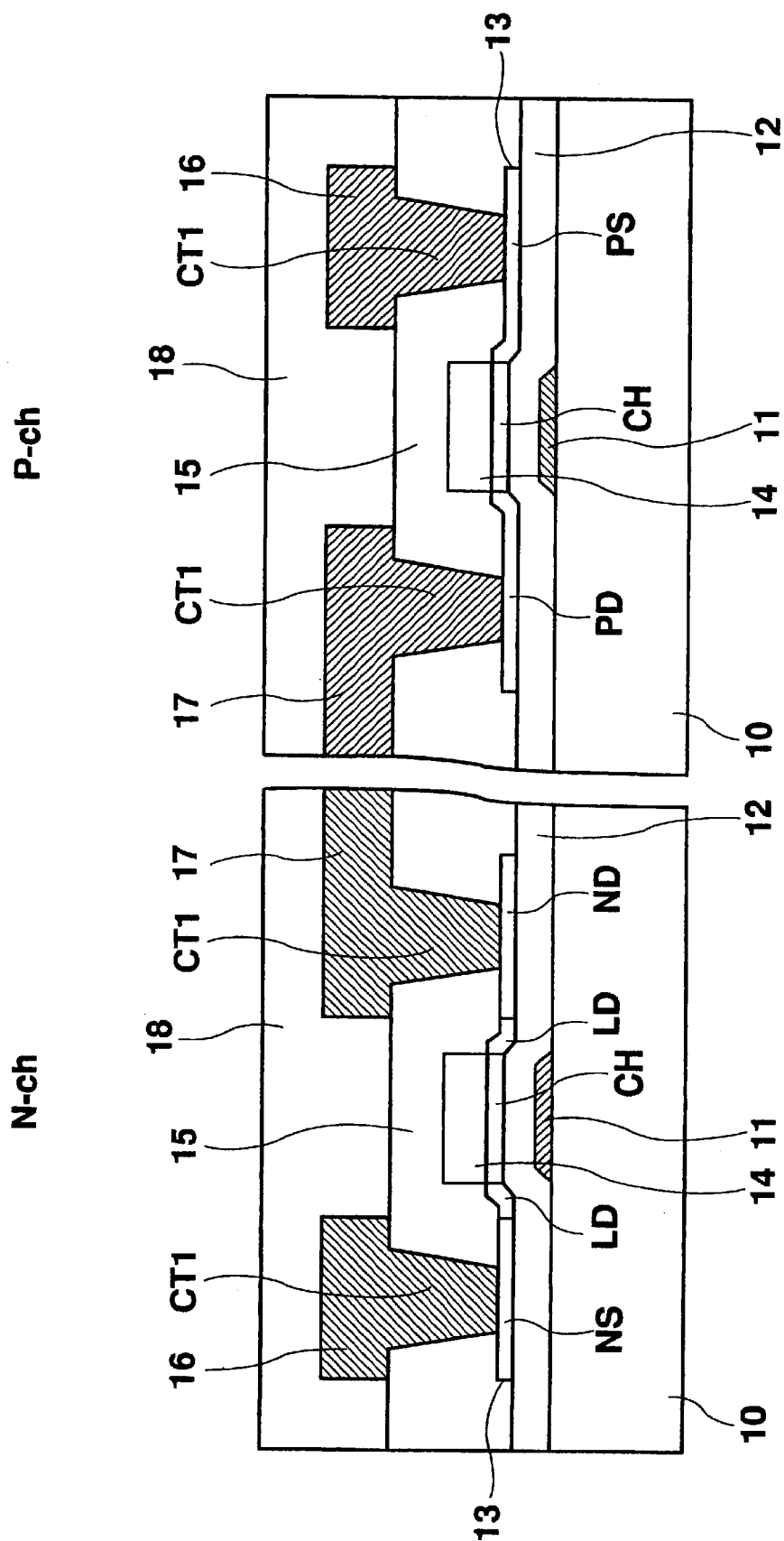
FIG. 9 is a sectional diagram taken on line A—A of FIG. 7 and FIG. 8.

FIG. 7 and FIG. 8 are enlarged plan views of TFTs at the inverters formed in different positions in the drain driver 4 of the driver built-in p-Si TFT LCD according to the embodiment of the invention. FIG. 9 is a sectional diagram taken on line A—A of FIG. 7 and FIG. 8. In these drawings, the N-ch TFT is shown on the left side and the P-ch TFT is shown on the right side.

A gate electrode 11, which is connected to a given inverter input and made of a conductive layer of Cr or the like, is formed on a transparent substrate 10 of non-alkali glass or the like. A gate insulating film 12 is formed of an insulating layer of SiNx or $SiO_2$ to cover the substrate 10 and the gate electrode 11.

On the gate insulating film 12, a p-Si film 13 is formed like an island in N-ch and P-ch areas. The p-Si film 13 lies across over the gate electrode 11 at two positions for N-ch and for P-ch, and a non-doped channel area CH is formed just above the gate electrode 11. In other words, both the N-ch TFT and the P-ch TFT have two channel areas CH.

In the N-ch TFT, an LD (lightly doped) area LD, which is doped with a low concentration of N-type impurities, is formed on both sides of the channel area CH, and a source area NS and a drain area ND, which are doped with a high concentration of N-type impurities, are formed next to the LD areas LD. On the P-ch side, the non-doped channel area CH has on both its sides a source area PS and a drain area PD, which are doped with a high concentration of P-type impurities.

An implantation stopper 14 made of $SiO_2$ or the like is formed on the channel area CH so to serve as a mask for ion doping to be described afterward, namely forming the LD area LD, and also in forming the source and drain area PS, PD on the P-ch side. An interlayer insulating film 15 of SiNx, $SiO_2$ or the like is formed to cover the p-Si film 13 and the implantation stopper 14. A source electrode 16 and a drain electrode 17, which are made of a high conductive layer of Al, Mo or the like, are formed on the interlayer insulating film 15 and connected to the source areas NS, PS and the drain areas ND, PD of the p-Si film 13 through contact holes CT formed in the interlayer insulating film 15. The drain electrode 17 is connected to a given inverter output, the source electrode 16 on the N-ch side to a low voltage source, and the source electrode 16 on the P-ch side to a high voltage source.

An insulating film 18 of SOG (spin on glass) or BPSG (Boro-Phospho Silicate Glass) having a planarization is formed to fully cover the electrodes. A TFT used as a switching element on the display area 2 of FIG. 6 is generally an N-ch and has the same sectional structure as the left side of FIG. 9. However, a pixel electrode (not shown) for driving the liquid crystal is formed on the planarizating insulating film 18 and connected to the source electrode 16 through the contact holes formed in the planarizating insulating film 18.

As will be apparent from FIG. 7, the invention is characterized in that the island area of the p-Si film 13 is a strip bent at right angles and consists of horizontal portions NH, PH and vertical portions NV, PV. Therefore, in one TFT of the N-ch, a charge transfer passage, namely a channel, extending through the source area NS—the LD area LD—the channel area CH—the LD area LD—the drain area ND comprises the portion NH directed in the horizontal scanning direction H and the portion NV directed in the vertical scanning direction V in the drawing. As to the P-ch, a channel extending through the source area PS—the channel area CH—the drain area PD comprises the portion PH directed in the horizontal scanning direction PH and the portion PV directed in the vertical scanning direction V in the drawing.

In this embodiment, however, the island area of the p-Si film 13 is not limited to a shape in which the horizontal portions NH, PH and the vertical portions NV, PV are integrally connected, but may have a shape in which the horizontal portions NH, PH and the vertical portions NV, PV are separated. However, the single TFT is required to have one end of two channels connected to a common source electrode 16 and the other end to a common drain electrode 17. Both P-ch TFT and N-ch TFTs can be configured so that the horizontal and vertical portions are further separated into a plurality of areas respectively.

The horizontal portions NH, PH and the vertical portions NV, PV are not necessarily Limited to the right-angled relationship but can have an angle falling in a range of larger than 0 degree and less than 180 degrees.

Figure 2:
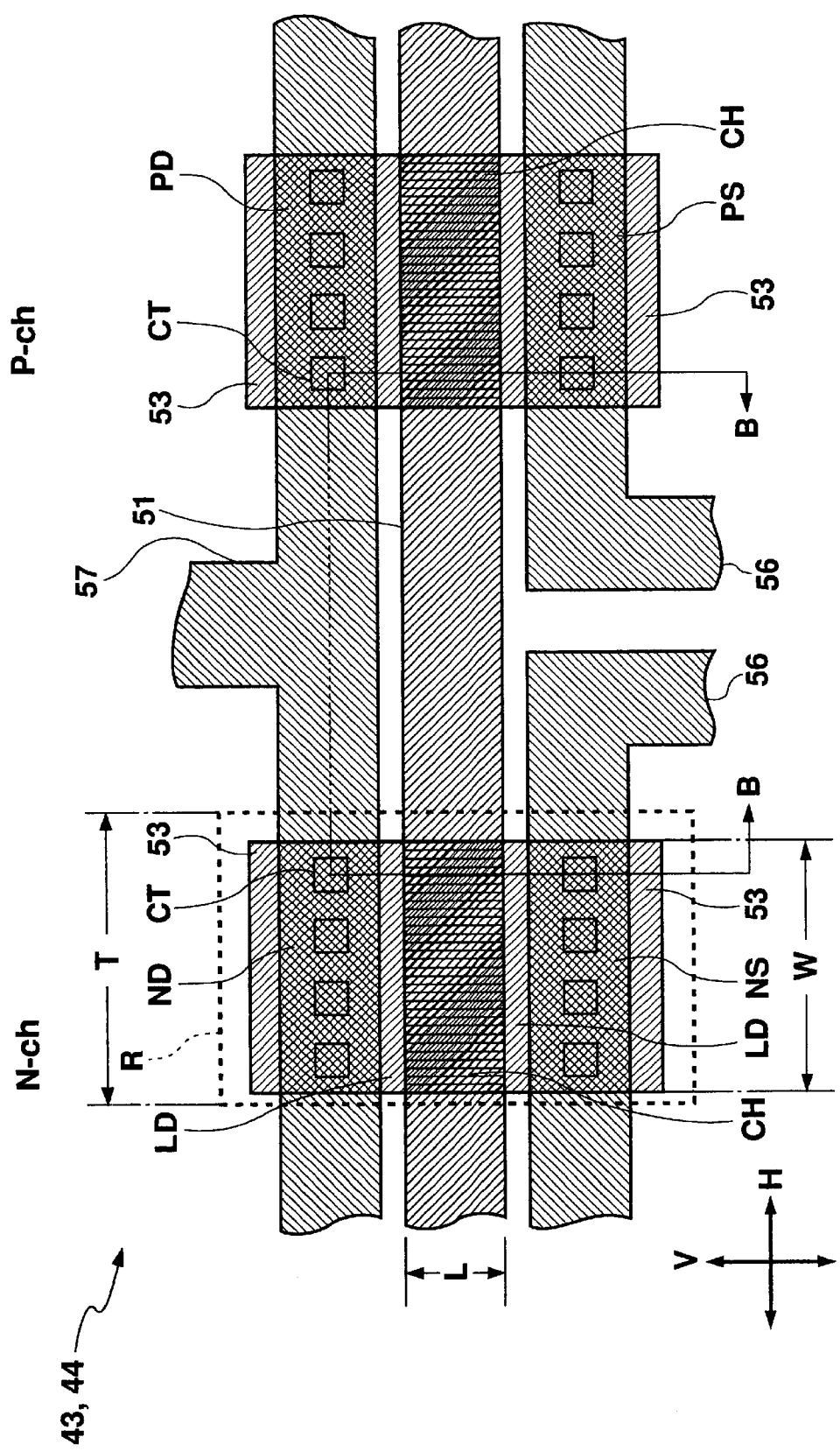
FIG. 2 is a diagram showing a plan configuration of TFT used in drivers 43, 44 of FIG. 1.
Figure 3:
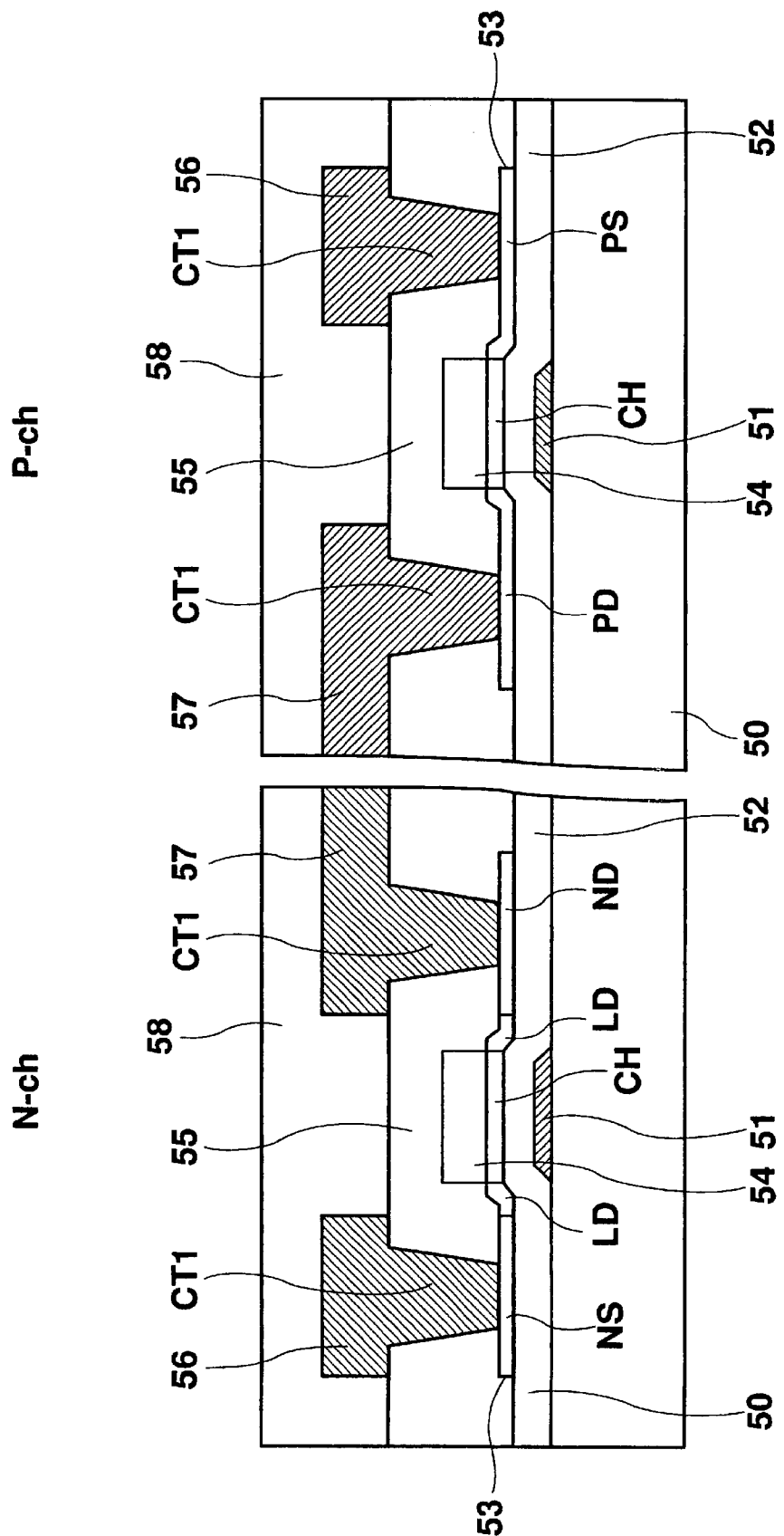
FIG. 3 is a sectional diagram taken on line B—B of FIG. 2.
Figure 4:
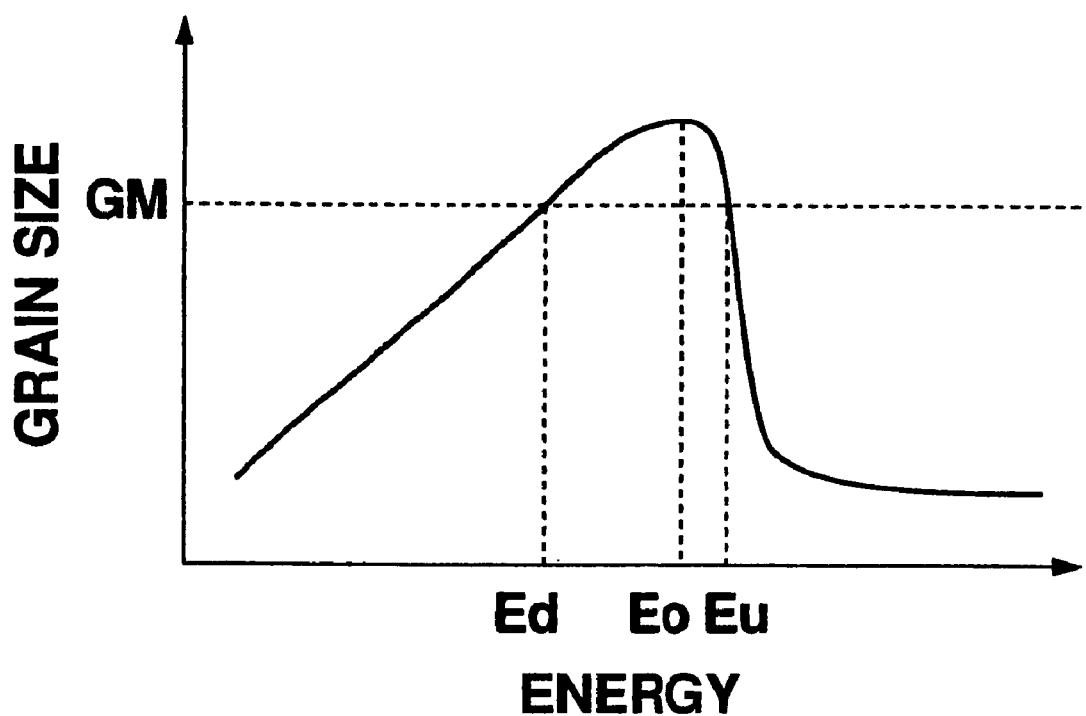
FIG. 4 is a diagram showing relationships between irradiated laser energy for ELA and a grain size of p-Si obtained.
Figure 5:
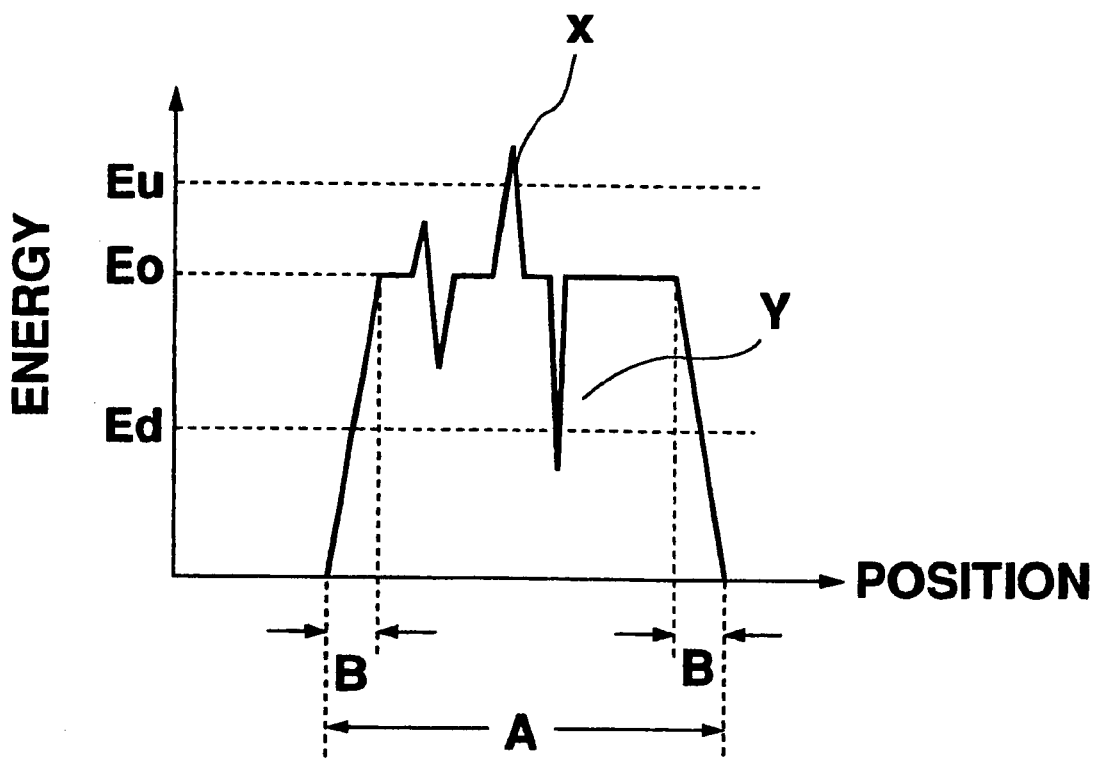
FIG. 5 is a diagram showing the distribution of energy in a direction of width A of the irradiated laser beam.

It is seen in FIG. 8 that two island areas of the p-Si film 13 are respectively formed on an N-ch TFT and a P-ch TFT; they are separated from each other but electrically connected in parallel. In other words, for the N-ch, two channels are separately formed extending through the drain area ND—the LD area LD—the channel area CH—the LD area LD—the source area NS, and for the P-ch, two channels are separately formed extending through the drain area PD—the channel area CH—the source area PS. A virtual overall width W1 of the channels including the area between two channel areas CH of P-ch TFT and N-ch TFT in this embodiment is made larger than the channel width W shown in FIG. 2. Thus, even if a defective crystallization area R is formed along the direction of the channel length, it becomes highly likely that the remaining area of the channel area CH will be out of the defective crystallization area R in the breadth direction of the channel. That means channel width reduction is suppressed.

Further, the average width of the defective crystallization area R formed in the shape of a strip is determined previously and the distance W1 between both outer sides of the two separated channels is determined larger than a width T of the defective crystallization area R. Accordingly, even when the defective crystallization area R is formed across the TFT area, there is definitely a portion out of the defective crystallization area R with respect to the channel width direction. Therefore, the performance characteristics of TFT can be prevented from being degraded substantially without changing the designed W/L value.

Now, a method for manufacturing such an LCD TFT will be described below.

Figure 10:
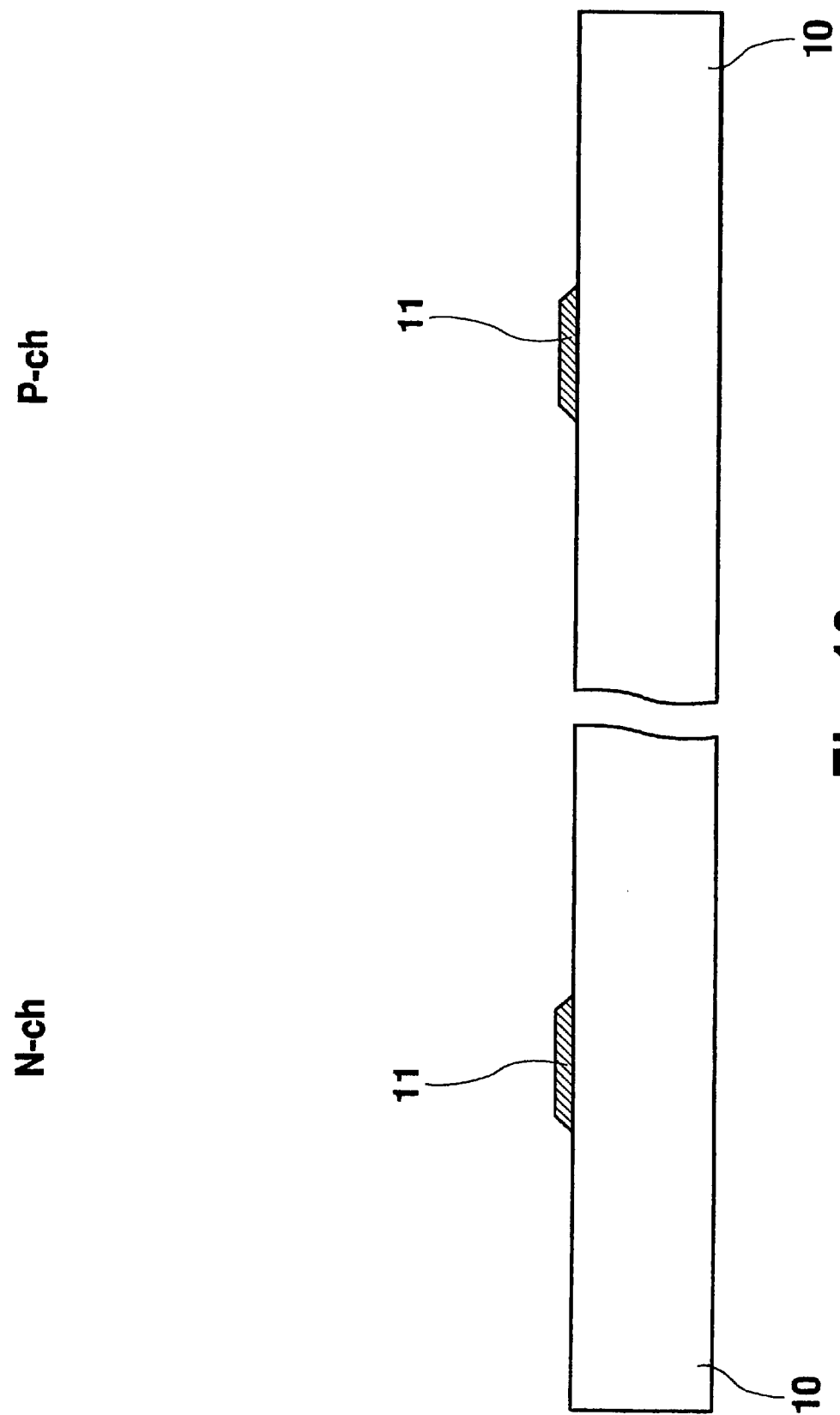

In FIG. 10, Cr is sputtered to form its film on the substrate 10 of non-alkali glass. The formed film is then etched to form the gate electrode 11.

As shown in FIG. 11, a gate insulating film 12 of SiNx or $SiO_2$ is formed on the entire surface of the substrate 10 to cover the gate electrode 11 by plasma CVD and subsequently amorphous silicon (a-Si) 13a is deposited by the plasma CVD. The a-Si 13a is formed by decomposing and depositing mono-silane $SiH_4$ or disilane $Si_2H_6$ as source gas by heating at about 400° C. and plasma.

Figure 12:
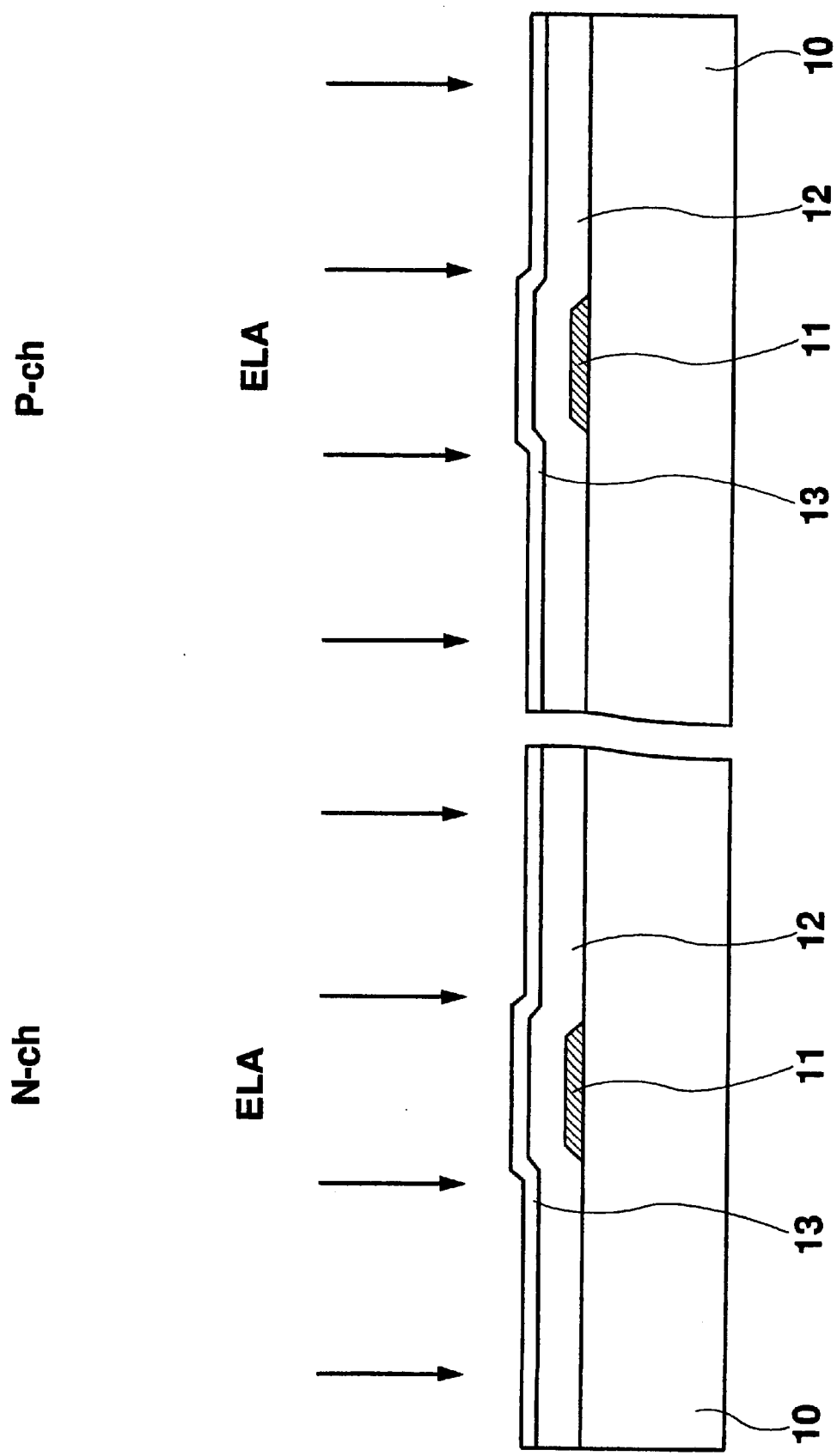

In FIG. 12, the a-Si 13a is crystallized by performing ELA at about 600° C. to form the p-Si 13. The ELA is performed by, for example, line beam scanning by the pulse laser, but a linear defective crystallization area R as shown in FIG. 6 may remain after the passage of the line beam.

Figure 13:
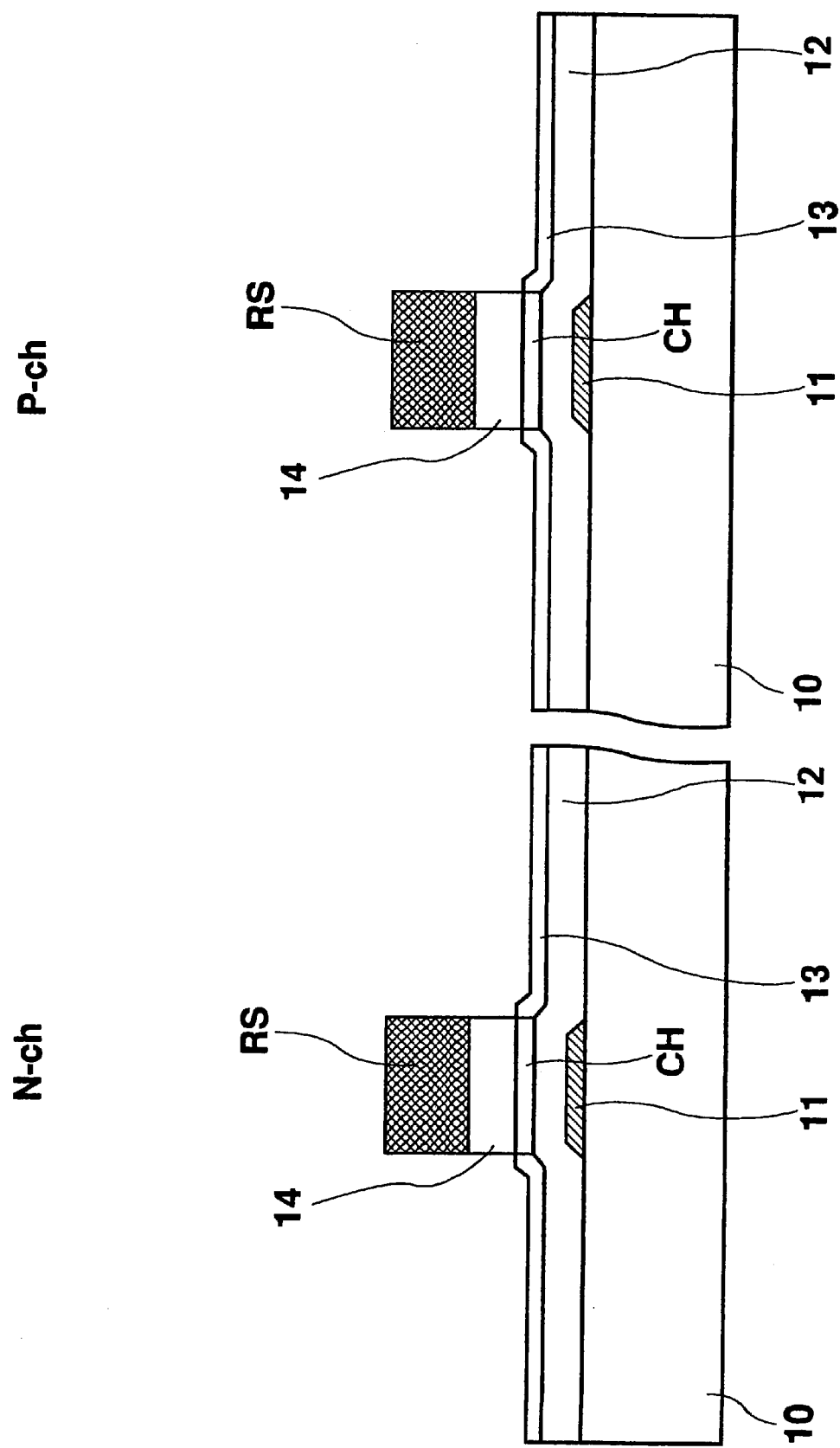

It is seen in FIG. 13 that a film of $SiO_2$ is formed on the p-Si 13. The formed film is then etched by a back exposure method to form an implantation stopper 14 above the gate electrode 11. In the back exposure method, a resist RS is applied onto $SiO_2$, it is exposed from below (back) the substrate 10 to expose an area excluding a region that is behind the gate electrode 11 to light, and development is carried out. Etching is carried out with the resist RS remaining after developing as a mask to form the implantation stopper 14 which reflects the pattern of the gate electrode 11.

Figure 14:
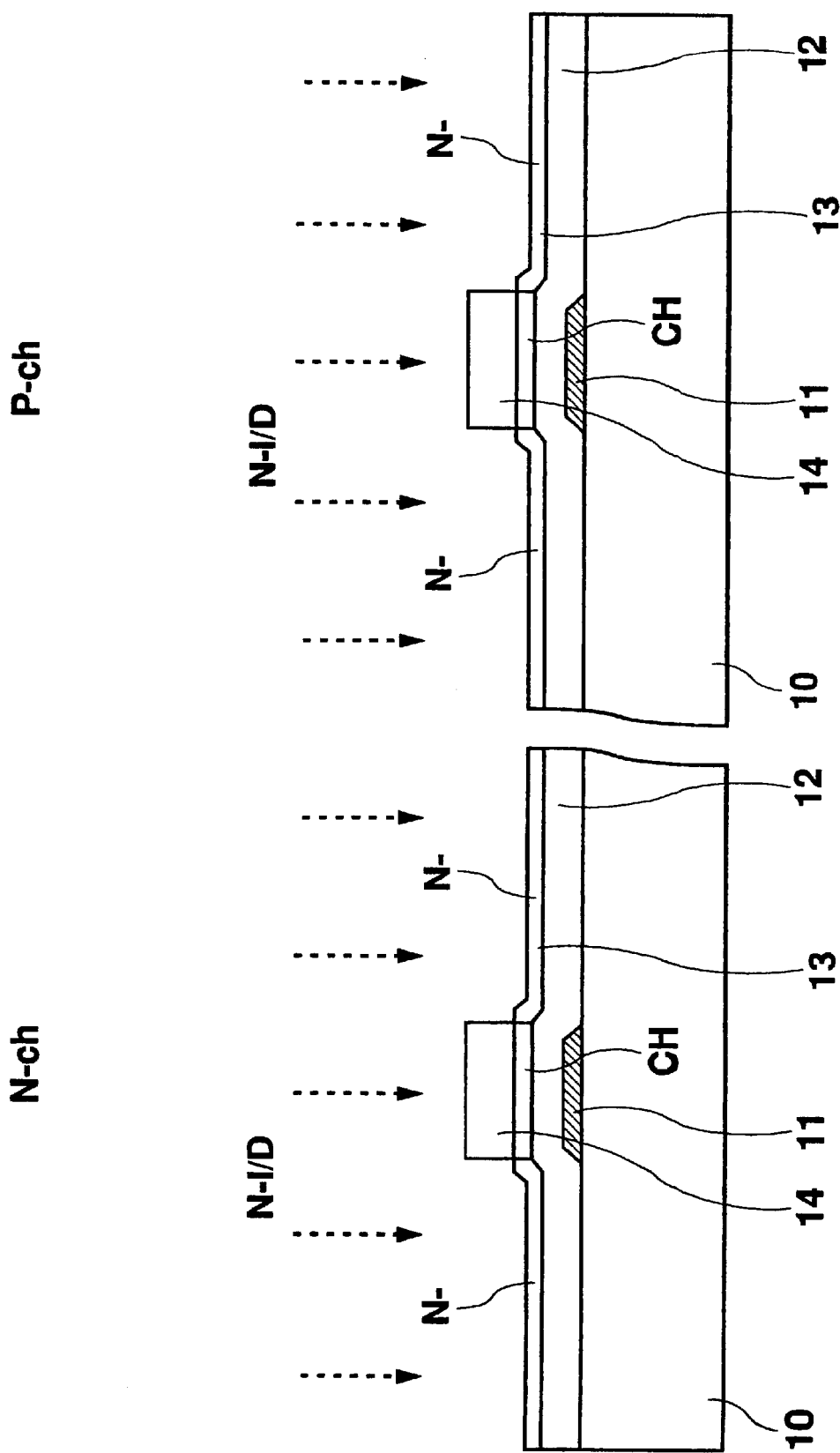

As shown in FIG. 14, phosphorous (P) ions having N-type conduction are doped at a small dose of about $10^{13}$ into the p-Si 13 with this implantation stopper 14 used as a mask so to dope (N−) the area not covered with the implantation stopper 14 to a low concentration. At this time, the area just below the implantation stopper 14, namely just above the gate electrode 11, is kept as a non-doped intrinsic layer, which later becomes the channel area CH of the TFT as shown in FIG. 7 and FIG. 8. The resist used for etching the implantation stopper 14 may be left as it is when the ions are implanted, and then removed after the ion dope.

Figure 15:
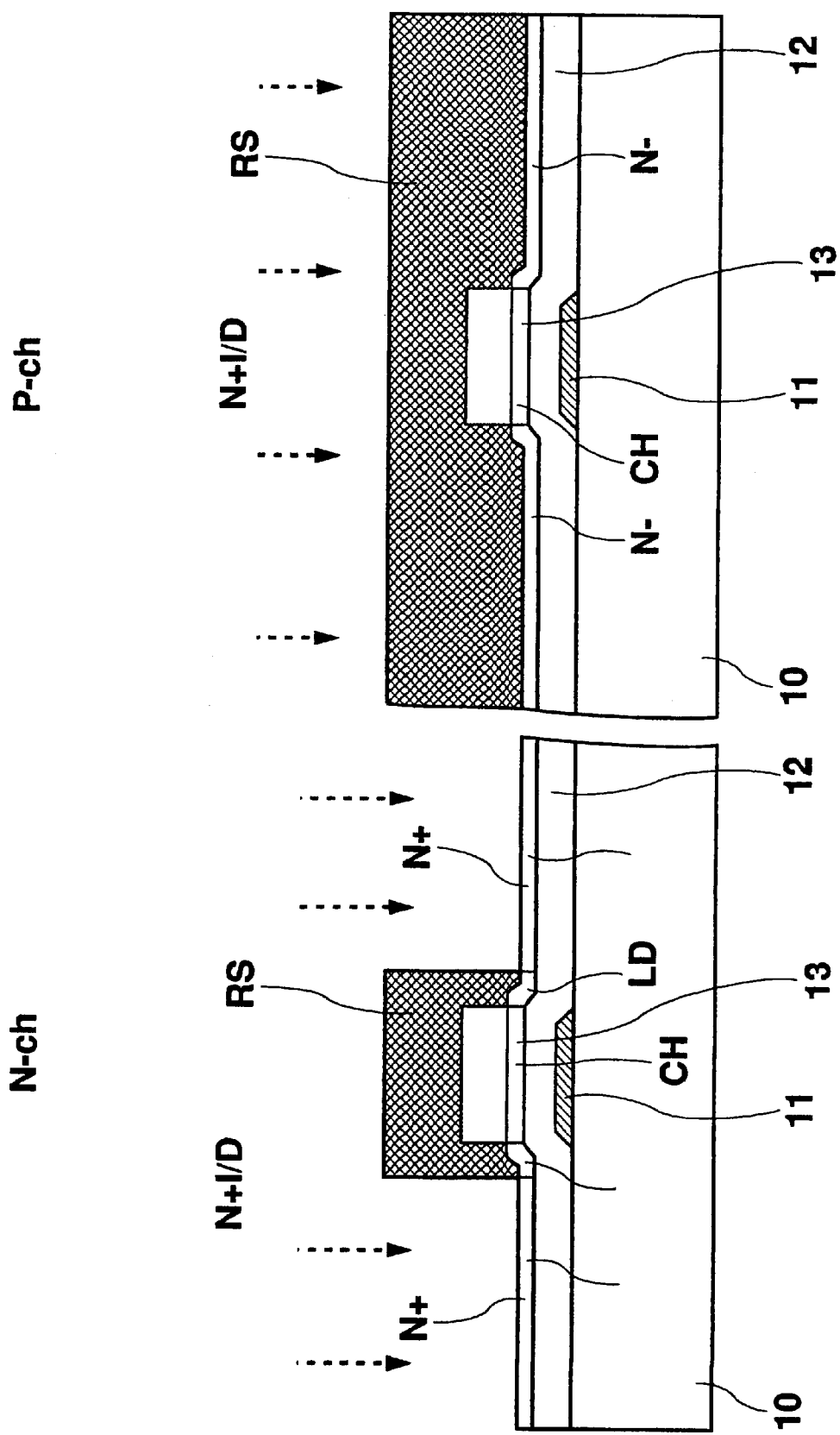

Referring to FIG. 15, a resist RS larger than the gate electrode 11 is formed on the N-ch side as a mask, and phosphorous (P) ions are implanted at a high dose of about $10^{15}$ into the p-Si 13 to dope (N+) at a high concentration the area not covered with the resist RS. At this time, the area just below the resist RS keeps the low concentration area (N−) and the channel area (CH). Thus, the LD area LD with a low concentration is formed on both sides of the channel area CH, and the source and drain areas NS, ND at a high concentration are formed next to the LD areas LD to configure the LDD structure. At this time, the P-ch side is covered with the resist RS to prevent it from being doped with the N-type impurities.

Figure 16:
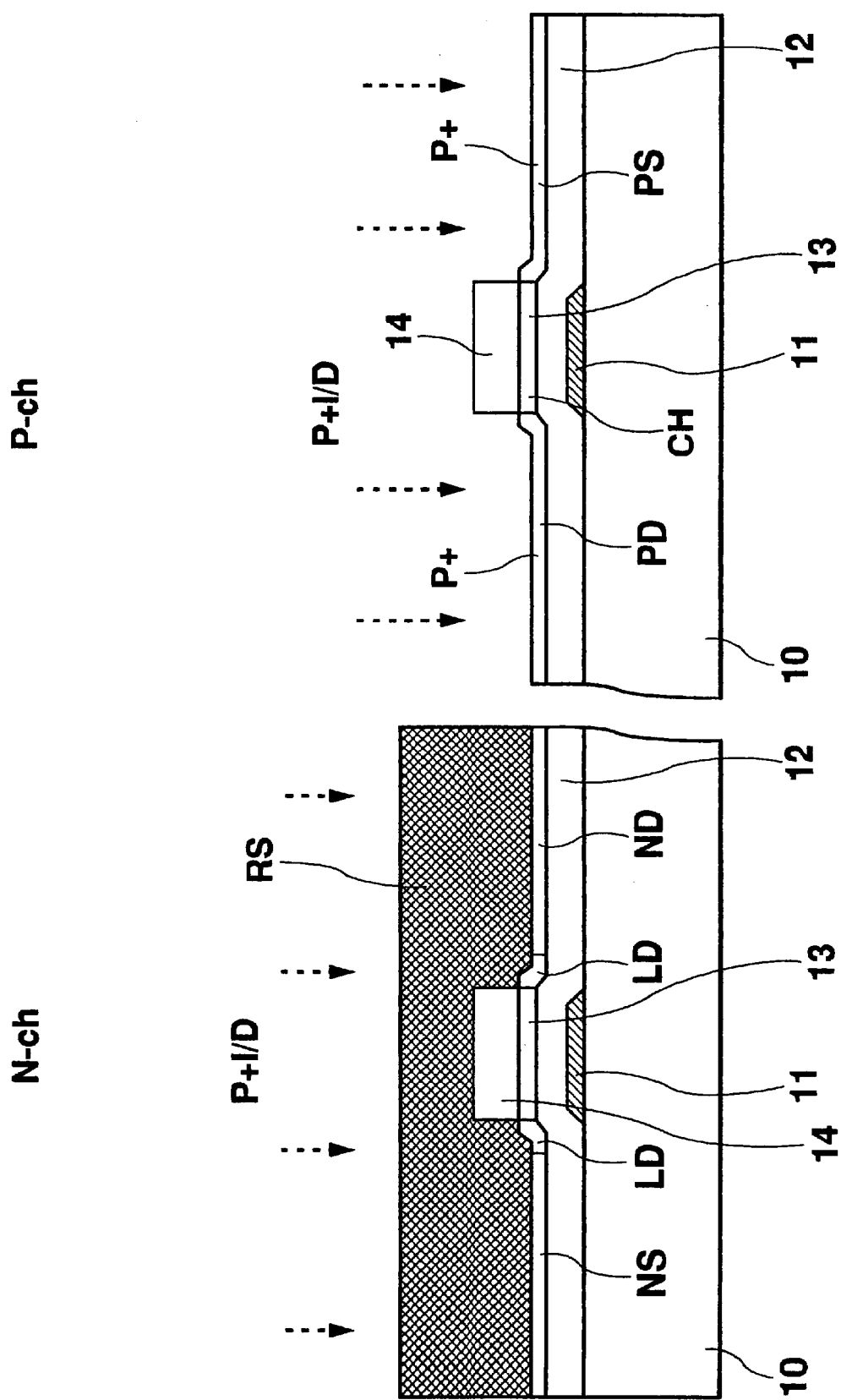

As shown in FIG. 16, the previous resist RS is removed, and another resist RS is formed on the N-ch side. In this state, P-type impurity ions of boron or the like are implanted into the p-Si 13 at a dose of about $10^{15}$. Thus, the portion just below the implantation stopper 14 becomes the channel area CH of the intrinsic layer, and both its sides are doped with P-type impurities at a high concentration (P+) to form the source and drain areas PS, PD.

After removing the resist RS, activation annealing is performed by heating or laser irradiation in order to recover crystallinity of the p-Si film 13 subjected to the doping with the impurity ions and the lattice replacement of the impurity.

Figure 17:
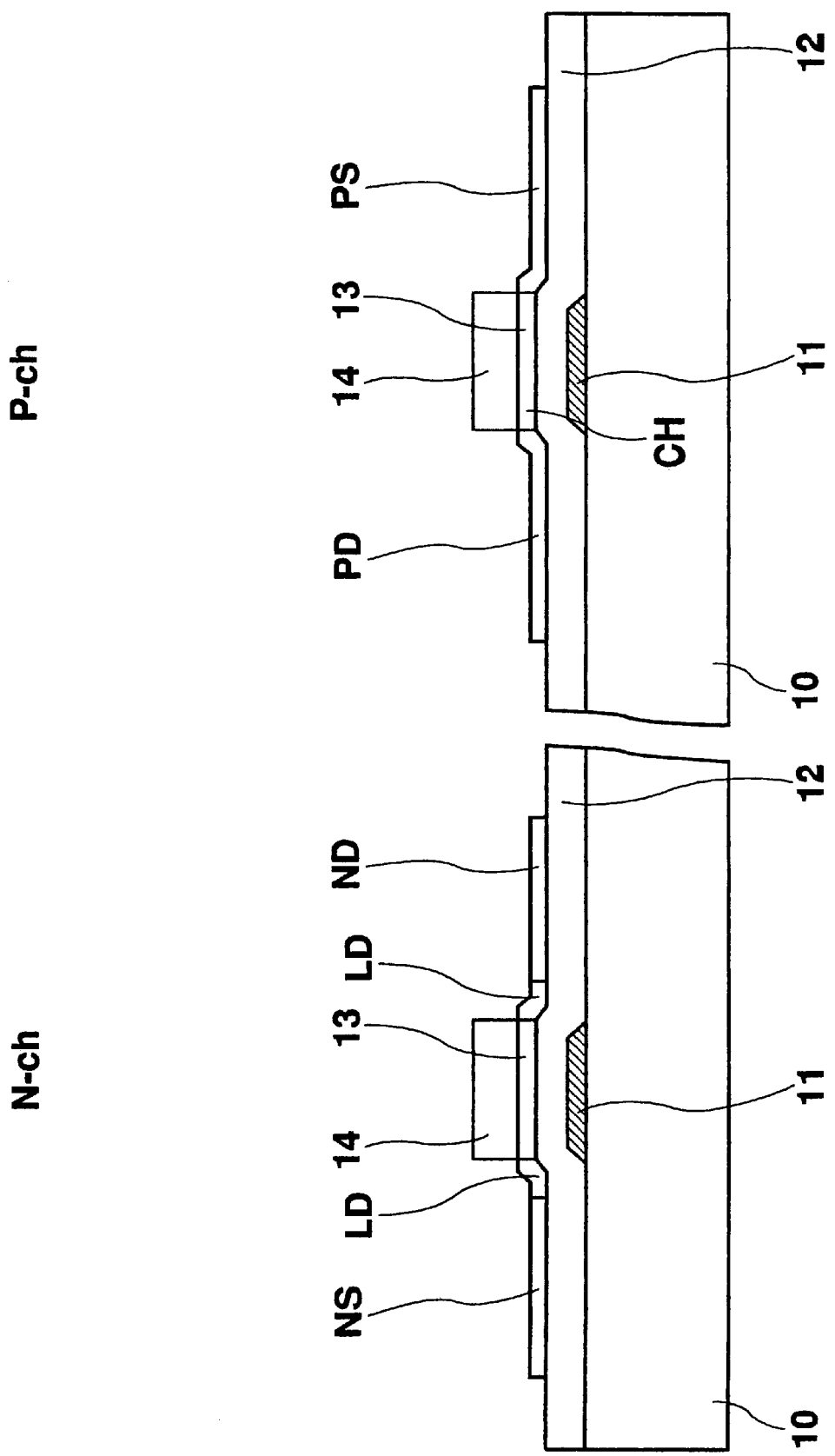

In addition, as shown in FIG. 17, the p-Si 13 is etched to have the pattern as shown in FIG. 7 or FIG. 8, thereby forming islands on the area required for a TFT.

Figure 18:
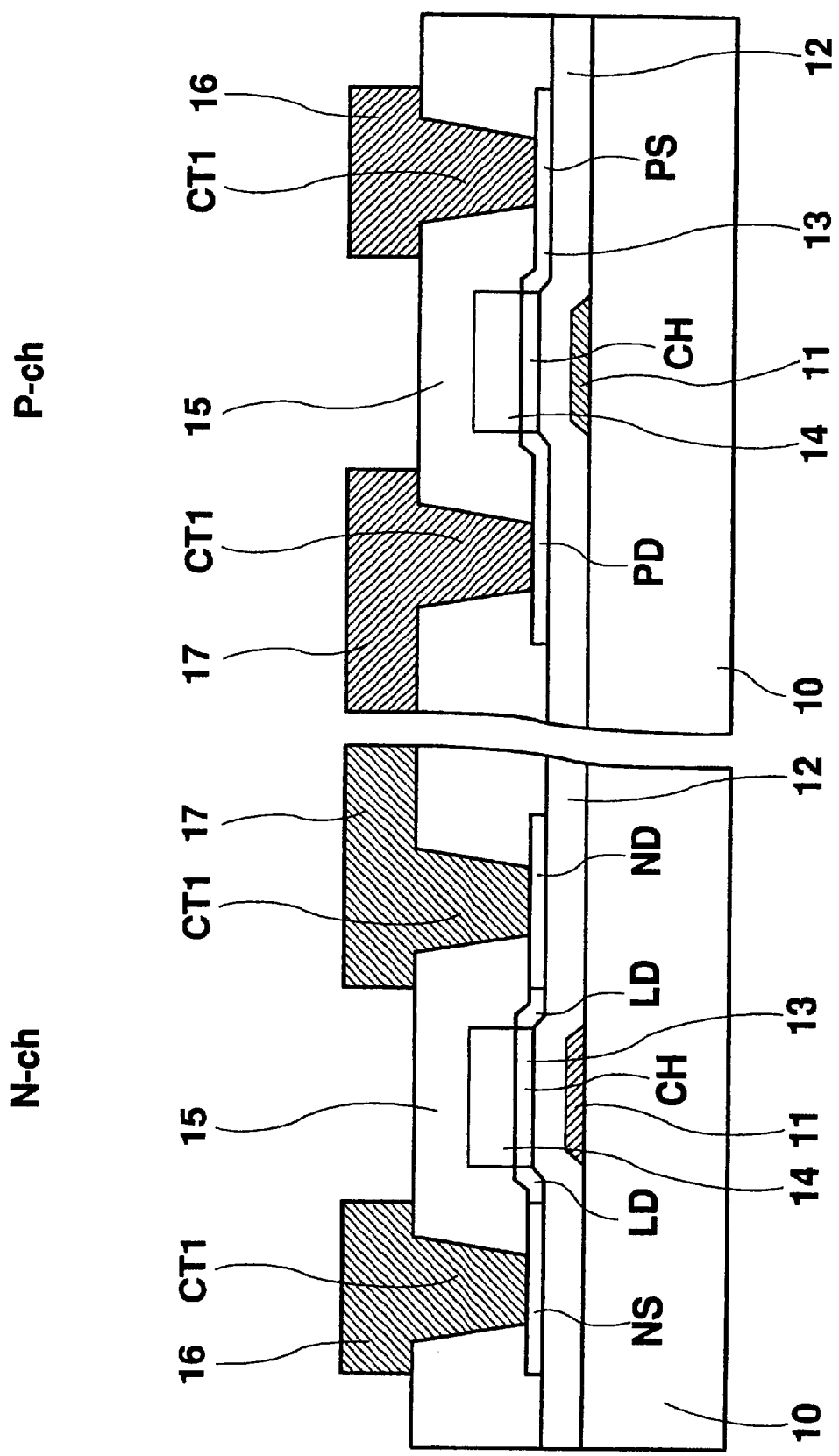

As shown in FIG. 18, SiNx is formed into an interlayer insulating layer 15 by plasma CVD, and portions corresponding to the source and drain area., NS, PS, ND, PD are removed by etching to form contact holes CT so to partly reveal the p-Si 13. Then, Al/Mo is deposited by sputtering, and the prepared layer is etched to form the source electrode 16 and the drain electrode 17, which are connected to the source areas NS, PS and the drain areas ND, PD to complete the TFT.

Figure 19:
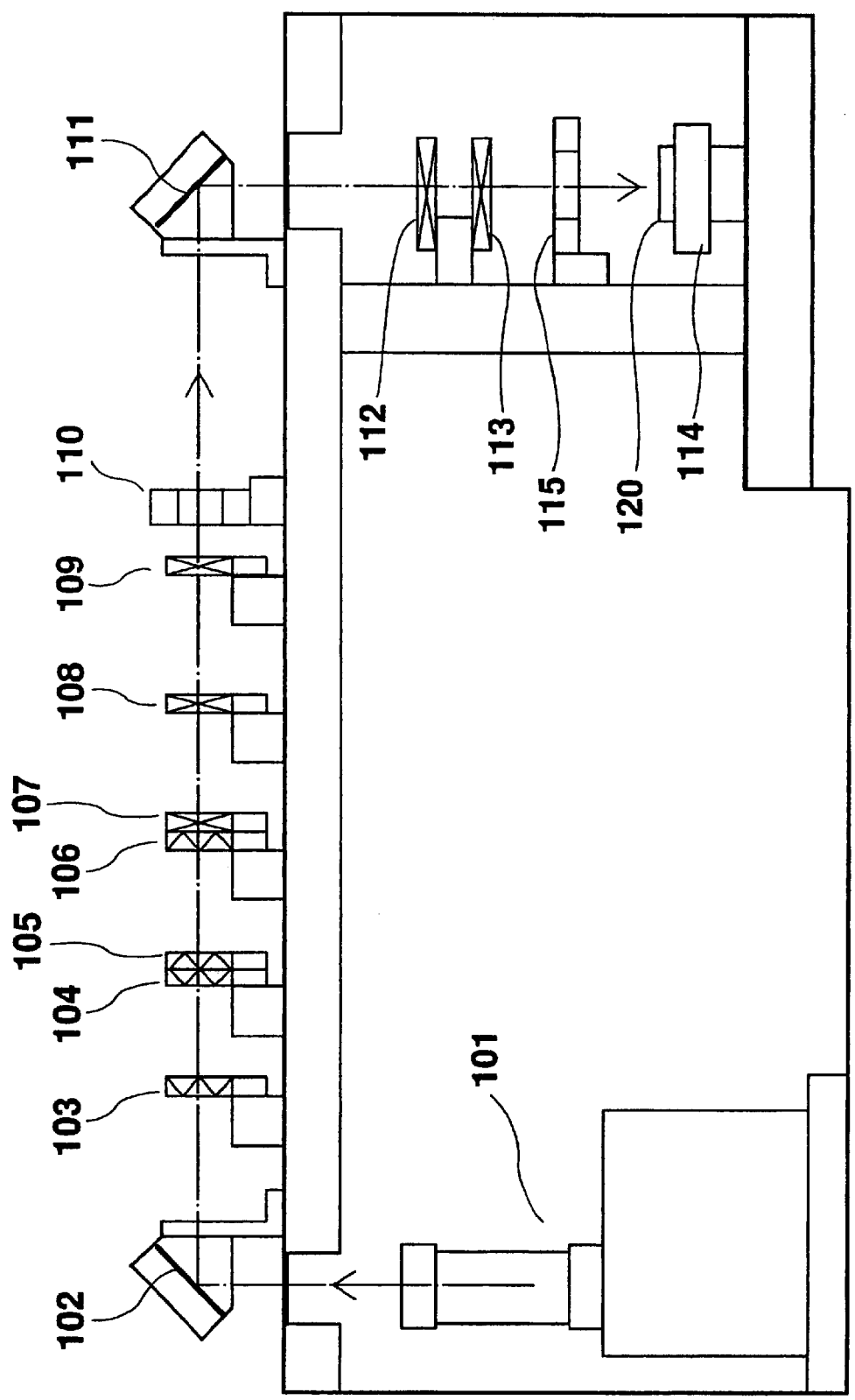
FIG. 19 is a diagram showing a configuration of a laser irradiating apparatus used in an embodiment of the invention.

In the crystallization ELA step shown in FIG. 12, the laser light irradiation apparatus as shown in FIG. 19 is used. In FIG. 19, 101 is a laser oscillation source, 102, 111 are mirrors, 103, 104, 105, 106 are cylindrical lenses, 107, 108, 109, 112, 113 are condenser lenses, 110 is a slit in a direction of a line width, and 114 is a stage for supporting a subject substrate 120 to be processed which has a-Si formed on its surface. 115 is a slit in a direction of a line length and is disposed close to the stage 114.

Laser light, e.g., an excimer laser, is irradiated from the laser oscillation source 101 and transformed into parallel light having a flat output intensity distribution with respect to all directions through the two sets of condenser lenses consisting of the cylindrical lenses 103, 105 and 104, 106. This parallel light is converged into one direction through the lenses 108, 109, 112, 113 and also expanded into another direction through the lens 107 into a square or strip light, but practically into a line beam, before being irradiated to the subject substrate 120. The slits 110, 115 each specify the edges in directions of the line width and line length to clarify the shape of an area to be irradiated and to keep the intensity in an effective irradiation area constant. The stage 114 supporting the subject substrate 120 is movable in directions X, Y, scanned in a direction of its line width with the irradiated line beam, thereby realizing laser annealing at a high throughput by processing a large area.

The pulse laser beam irradiated to the substrate 1 by such a laser light irradiation apparatus is modified so that the area to be irradiated has a linear, strip or square shape. However, dust or the like adhering to the optical system induces variations in the irradiated energy within the shaped beam so as to follow the sides directions of the beam-irradiated area. As a result, a defective crystallization area R is formed along the sides of the pulse laser beam in the irradiated area on the p-Si film because the laser beam which deviates from an applied energy permissible range for obtaining an optimum grain size is also formed by converged and expanded through optical system.

In a case where the shots of line beams of the pulse laser have variations in energy, crystallinity is never recovered by a shot following the end of the line beam in the scanning direction, and a defective crystallization area R is formed. A TFT formed in the area containing such a defective crystallization area R has a substantially narrow channel width and its element characteristics become inferior.

However, on one TFT as shown in FIG. 7, a channel, which connects the drain areas ND, PD (especially, contacts CT with the drain electrode 17), the LD area LD (for the N-ch), the channel area CH, the LD area LD (for the N-ch), and the source areas NS, ND (especially, contacts CT with the source electrodes 16)), comprises two portions; horizontal portions NH, PH and vertical portions NV, PV in the drawing.

The defective crystallization area R is generally formed in lines in the horizontal direction H or the vertical direction V with respect to the substrate 1. These lines of the defective crystallization area R coincide with either of the horizontal portions NH, PH and the vertical portions NV, PV of TFT of FIG. 7. Therefore, when the defective crystallization area R is formed in the horizontal direction H or the vertical direction V, and even if either of the horizontal portions NH, PH and the vertical portions NV, PV of the TFT is included in the defective crystallization area R, making it defective, the remaining one is outside of the defective crystallization area R and operates normally. Thus, the TFT element operates normally, and adverse effects on driving and displaying can be prevented.

As shown in FIG. 8, the invention arranges two p-Si films 13 separately on one TFT so to configure the channels connecting the drain areas ND, PD (especially, the contact CT with its drain electrode 17), the channel area CH and the source areas NS, PS (particularly, the contact CT with its source electrode 16) separated in the direction of the channel width. Also, in the N-ch TFT, more specifically, the channels connecting the drain area ND, the LD area LD, the channel area CH, the LD area LD and the source area NS are separately arranged in the direction of the channel width.

Accordingly, the defective crystallization area R is caused in the vertical direction in the drawing, and even if it is caused to run through the p-Si film 13, the other p-Si film 13 has a high possibility of being excluded from the defective crystallization area R. Therefore, the TFT can be operated normally using the p-Si film 13 on one side.

Generally, the operation characteristics of a TFT are controlled depending on a ratio of the channel width W and the channel length L, namely a W/L value. In the channel of TFT having a given W value, the TFT characteristics are degraded with the increase of a ratio occupied by the defective crystallization area R. However, such a ratio occupied by the area R can be decreased by the present invention even if the W value is the same, by configuring it by a plurality of channels divided into several portions.

Therefore, the TFT operates normally, and no adverse effect is caused on driving and displaying.

While there have been described that what are at present considered to be preferred embodiments of the invention, it is to be understood that various modifications may be made thereto, and it is intended that the appended claims cover all such modifications as fall within the true spirit and scope of the invention.

What is claimed is:

1. A display device, comprising:
   a plurality of pixel electrodes formed on a substrate;
   a plurality of first thin film transistors, which are connected to corresponding pixel electrodes among the plurality of pixel electrodes and respectively supply the connected corresponding pixel electrode with a display signal; and
   a plurality of second thin film transistors, which configure a driving circuit for driving the plurality of first thin film transistors; wherein,
   some or all of the plurality of second thin film transistors each has a plurality of channel areas formed in a semiconductor layer subjected to laser annealing respectively, and the plurality of channel areas of each respective second thin film transistor are electrically connected in parallel to each other and arranged separately.

2. The display device according to claim 1, wherein the plurality of channel areas are separated in a direction of the channel width.

3. The display device according to claim 2, wherein a distance between the plurality of channel areas is determined that a virtual channel width containing a separated space is larger than a width of a defectively processed area caused in the semiconductor layer during the laser annealing.

4. The display device according to claim 1, wherein the laser annealing is performed to polycrystallize an amorphous semiconductor layer in order to obtain a polycrystalline semiconductor layer.

5. A display device, comprising:
   a plurality of pixel electrodes arranged on a substrate;
   a plurality of first thin film transistors, which are connected to corresponding pixel electrodes among the plurality of pixel electrodes and respectively supply the connected corresponding pixel electrode with a display signal; and
   a plurality of second thin film transistors, which configure a driving circuit for driving the plurality of first thin film transistors; wherein,
   some or all of the plurality of second thin film transistors each has a plurality of channel areas formed in a semiconductor layer subjected to laser annealing respectively, and the plurality of channel areas of each respective second thin film transistor are electrically connected to each other and arranged toward different directions.

6. The display device according to claim 5, wherein the plurality of channel areas are arranged so to be orthogonal to each other in a direction of the channel width.

7. The display device according to claim 5, wherein the plurality of channel areas are formed in one island semiconductor area.

8. The display device according to claim 5, wherein the plurality of channel areas are arranged separately to each other.

9. The display device according to claim 5, wherein the laser annealing is performed to polycrystallize an amorphous semiconductor layer in order to obtain a polycrystalline semiconductor layer.

* * * * *